(12) United States Patent
Brown et al.

(10) Patent No.: US 6,407,608 B1
(45) Date of Patent: *Jun. 18, 2002

(54) CLOCK INPUT BUFFER WITH INCREASED NOISE IMMUNITY

(75) Inventors: Jason M. Brown, Stafford; Steven C. Eplett, Houston, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/271,461

(22) Filed: Mar. 18, 1999

Related U.S. Application Data

(60) Provisional application No. 60/078,829, filed on Mar. 20, 1998.

(51) Int. Cl.[7] ................................................ H03K 3/00
(52) U.S. Cl. ...................... 327/291; 327/294; 327/379; 327/389
(58) Field of Search ................................. 327/291, 294, 327/299, 293, 327, 379, 384, 386, 388, 389, 391, 108; 326/27–29

(56) References Cited

U.S. PATENT DOCUMENTS 4,498,021 A * 2/1985 Uya ............................ 326/86
6,023,181 A * 2/2000 Penny et al. ................ 327/299
6,023,182 A * 2/2000 Milshtein et al. ........... 327/299

FOREIGN PATENT DOCUMENTS

JP          5-22106    * 1/1993    ................ 326/29

* cited by examiner

*Primary Examiner*—Tuan T. Lam
(74) *Attorney, Agent, or Firm*—W. James Brady; Frederick J. Telecky, Jr.

(57) ABSTRACT

A clock buffer circuit (100) for generating buffered clock signals (CLKI and CLKI_) in response to an external clock signal (CLKX) is disclosed. A first buffer section (102) drives to a first output node (114) between high and low logic levels in reponse the CLKX signal. To reverse the adverse effects of noise on the falling edges of CLKX signal, a boost section (108) and clock generator (106) are provided. In response to low-to-high transitions at the first output node (114) the pulse generator (106) generates a pulse at a pulse output (126). In response to the pulse, the boost section (108) provides additional driving capability for further pulling the first output node (114) to the high logic level. The first output node provides the CLKI_ signal. A second buffer circuit (104) provides the CLKI signal in response to the CLKI_ signal. An enabling section (110) is provided for enabling, or alternatively, disabling the preferred embodiment (100). In addition, a hysteresis section (112) is also included to introduce hysteresis into the response of the preferred embodiment (100).

14 Claims, 1 Drawing Sheet

CLOCK INPUT BUFFER WITH INCREASED NOISE IMMUNITY

This application claims priority under 35 USC §119(e)(1) of provisional application number 60/078,829 filed Mar. 20, 1998.

TECHNICAL FIELD

The present invention relates generally to semiconductor device signal buffer circuits, and more particularly to clock buffer circuits for a semiconductor device.

BACKGROUND OF THE INVENTION

Many electronic systems are operated according to a system clock, which coordinates rapid operations between different semiconductor devices within the system. Data and commands can be transferred according to the clock signal allowing for rapid and efficient use of command and data bus lines. Semiconductor devices that function according to an external system clock are often referred to as synchronous devices, as their operation is synchronous with the system clock.

One type of synchronous semiconductor device is a synchronous random access memory (RAM). In many synchronous RAMs, data and command inputs are latched on the rising edge of the system clock signal. Similarly, synchronous RAMs typically latch input data, or provide output data in synchronism with the system clock. In order to ensure accurate timing of such operations, it is important that the synchronous RAM be able to receive the system clock signal, and distribute it to internal control and timing circuits, including input latches and output buffers.

Synchronous RAMs often include a clock buffer circuit for receiving the system clock signal and increasing its strength for use by other circuits within the synchronous RAM. A common buffer arrangement includes one or more inverter circuits arranged in series, that receive the system clock signal as an input, and provide the buffered clock as an output. A drawback to utilizing conventional inverter arrangements in synchronous semiconductor devices is the susceptibility of such circuits to noise. When a system is operating, the other circuits of the system may introduce noise into the system clock signal. A conventional buffer circuit can allow the noise to propagate through the buffer and into the circuits within. Noise on the falling edge of the clock signal can be interpreted incorrectly as a rising clock edge by internal circuits. This can result in an invalid command or address being latched by the synchronous RAM, output data being provided at an incorrect time.

The effects of noise on a system clock can be reduced by utilizing hysteresis. Hysteresis raises the level at which a rising clock transition will be detected, and/or lowers the threshold at which a falling clock transition will be detected. In this arrangement, temporary transitions between the hysteresis threshold voltages will not result in a false transition. A drawback to hysteresis is that it results in a delayed clock signal. Such a delay may not be acceptable in high-speed applications, as it lowers the response time of the semiconductor device. Thus, hysteresis may not be suitable for many synchronous RAMs which require very rapid data access times.

It would be desirable to provide a clock buffer circuit that reduces the effect of noise on a signal transition, but does not result in excessive delay in the buffered clock signal.

SUMMARY OF THE INVENTION

According to the preferred embodiment, a clock buffer circuit reduces the adverse effects of noise on the falling edge of a system clock signal by generating a pulse in response to the falling edge. The pulse temporarily enables a boost device within the clock buffer circuit, which strengthens the driving ability of the buffer circuit.

According to one aspect of the preferred embodiment, the pulse generated by the clock buffer circuit has a duration that is less than half of a system clock cycle, and so will not adversely affect the generation of low-to-high transitions in the buffered clock signal.

According to another aspect of the preferred embodiment, the clock buffer circuit includes an enabling circuit for placing the preferred embodiment in the disabled state. To rapidly place nodes within the buffer circuit into a disabled state, the boost device temporarily enabled.

An advantage of the preferred embodiment is that it provides a clock buffer circuit with increased noise immunity in which the speed of the buffered clock signal is not substantially affected.

DETAILED DESCRIPTION OF THE EMBODIMENTS

The preferred embodiment is an input clock buffer circuit that may be used in a synchronous dynamic random access memory (SDRAM). The clock buffer circuit receives an external system clock (CLKX) and provides internal clock signals (CLKI and CLKI_) that are synchronous with the CLKX signal. The CLKX signal transitions between a low-going signal portion and a high-going signal portion in a periodic manner. The CLKI and CLKI_ signals provided by the preferred embodiment may be used by other circuits within the SDRAM, such as address input and output circuits, and data input and output circuits. In particular, the CLKI and CLKI_ signals may be used by command buffer circuits to latch commands in synchronism with the rising edge of the CLKX signal.

The preferred embodiment reduces the effect of noise on the falling edge of the CKLX signal by temporarily activating additional driver circuits to "boost" the driving devices which generate the CLKI and CLKI_ signals. As a result, when the CLKX signal transitions from a high to low logic level, the CLKI signal is rapidly driven low and the CLKI_ signal is rapidly driven high, reducing the possibility that noise will cause a false transition.

Figure 1:
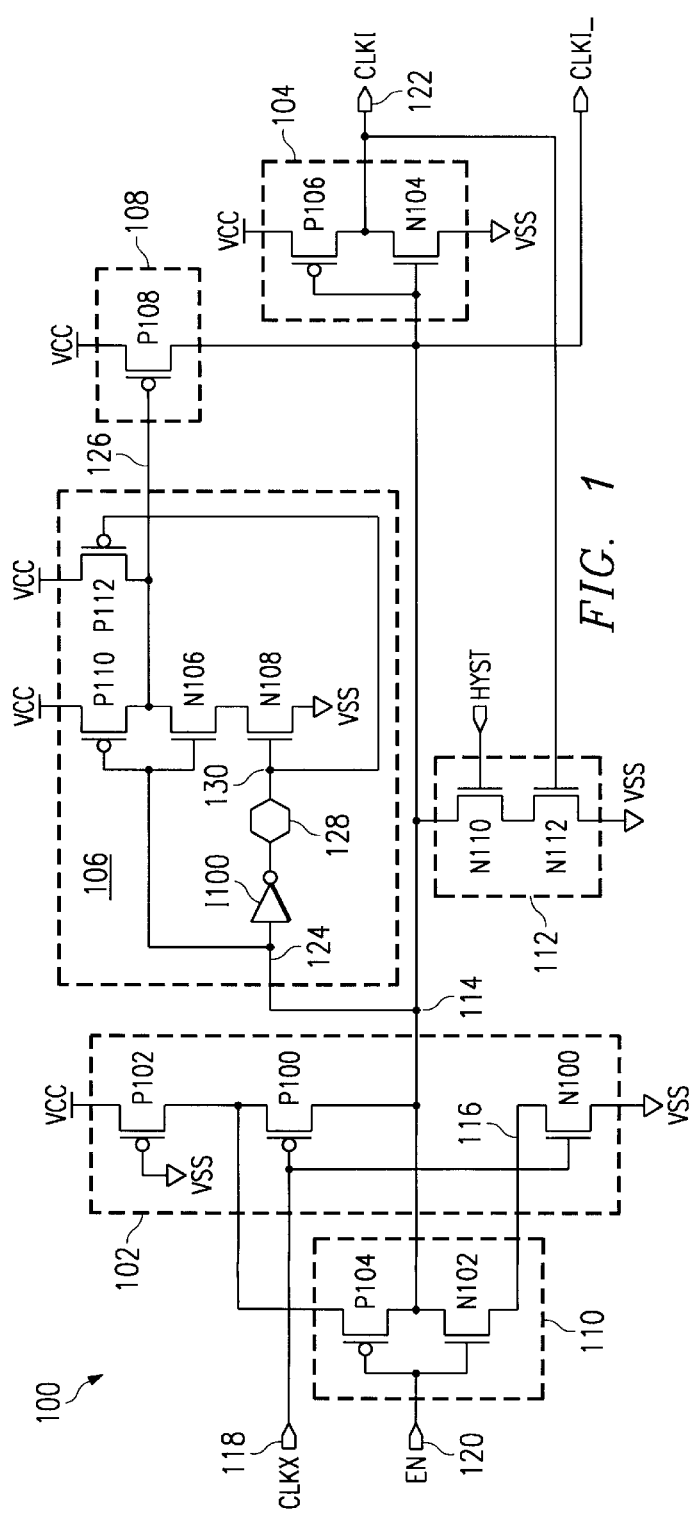
FIG. 1 is a detailed schematic diagram illustrating a clock buffer circuit of the preferred embodiment.

The preferred embodiment is realized with complementary metal(conductor)-oxide(insulator)-semiconductor (CMOS) technology, and so benefits from the reduced noise immunity and power dissipation characteristics thereof The preferred embodiment is set forth in FIG. 1, and shown to receive an external system clock signal CLKX that is to be distributed within a clocked integrated circuit (such as an SDRAM) as an internal clock signal. In the preferred embodiment, the internal clock signal is provided as two complementary clock signals, CLKI_ and CLKI. Two other input signals are also received by the preferred embodiment provided for initiating other, alternate modes of operation. An enable input signal EN is provided to enable, or alternatively disable, the preferred embodiment. A hysteresis signal HYST is provided to introduce hysteresis into the response of the preferred embodiment.

The preferred embodiment is designated by the general reference character 100, and can be conceptualized as including a first buffer section 102, a second buffer section 104, a pulse generator 106, a boost section 108, an enabling section 110, and a hysteresis section 112. The first buffer section 102 includes a p-channel MOS pull-up transistor P100, an n-channel pull-down transistor N100, and a p-channel MOS current supply transistor P102. Transistors P102 and P100 have source-drain paths coupled between a high power supply voltage VCC and a first output node 114. Transistor N100 has a source-drain path coupled between a low power supply voltage VSS and a pull-down node 116. The gate of current supply transistor P102 is coupled to the low power supply voltage VSS, and so is in an "on" state provided power is supplied to the preferred embodiment. The gates of pull-up transistor P100 and pull-down transistor N100 are commonly coupled to an external clock signal input node 118 that receives the CLKX signal.

The source-drain paths of the pull-up transistor P100 and pull-down transistor N100 provide a charge/discharge path for the first output node 114. In this arrangement, when the CLKX signal is low, pull-up transistor P100 is turned on, enabling a charging path to the high power supply voltage VCC. When the CLKX signal is high, pull-down transistor N100 is turned on, enabling a discharge path to the low power supply voltage VSS.

The enabling section 110 receives the enable signal EN and in response thereto, enables, or alternatively, disables the charge/discharge path of the first buffer section 102. In the preferred embodiment 100, the enabling section 110 includes a p-channel MOS disabling transistor P104 and an n-channel MOS enabling transistor N102. Disabling transistor P104 has a source-drain path coupled in parallel with pull-up transistor P100 (i.e., the source and drain of disabling transistor P104 are coupled to the source and drain, respectively, of the pull-up transistor P100). The enabling transistor N102 has a source-drain path coupled between the first output node 114 and the pull-down node 116. The gates of the disabling transistor P104 and enabling transistor N102 are commonly coupled to an enable node 120 which receives the EN signal.

When the EN signal is high, enabling transistor N102 is turned on and disabling transistor P104 is turned off. In this state, the enabling transistor N102 couples the pulldown node to the first output node 114, enabling the charge/discharge path of the first buffer section 102, allowing the pull-down transistor N100 to pull the first output node 114 to a low logic level. With the disabling transistor P104 turned off, the pull-up transistor P100 is capable of providing a charge path to the first output node 114 according to the CLKX value. In contrast, when the EN signal is low, transistor P104 is turned on, essentially bypassing the pull-up function of the first buffer section 102, and forcing the first output node 114 high. In addition, the enabling transistor N102 is turned off, preventing the first output node 114 from being pulled low. The first output node 114 provides the inverted clock output signal CLKI_.

The first output node 114 provides an input to the second buffer section 104. In the preferred embodiment 100, the second buffer section 104 includes a CMOS inverter configuration, having a p-channel MOS output transistor P106 and an n-channel MOS output transistor N104. The output transistors P106 and N104 have source-drain paths coupled between the high power supply voltage VCC and the low power supply voltage VSS. The gates of the output transistors (P106 and N104) are commonly coupled to the first output node 114. The drains of the output transistors (P106 and N104) are coupled to a second output node 122. The second output node 122 provides the CLKI signal.

When the first output node 114 is at a low voltage, output transistor N104 is turned off and transistor P106 is turned on, and the second output node 122 is pulled high. When the first output node 114 is at a high voltage, output transistor N104 is turned on and transistor P106 is turned off, and the second output node 122 is pulled low. In this manner, the second buffer section 104 provides the inverse of the first output node 114 at the second output node 122.

Unlike a conventional clock buffering arrangement, the preferred embodiment 100 further includes the boost section 108 that is enabled by the pulse generator 106. In general, the boost section 108 temporarily provides additional capability for driving the first output node 114. In the preferred embodiment 100, the boost section 108 boost the pull-up (charging) of the first output node 114, and is shown to include a p-channel MOS boost pullup transistor P108. Boost pull-up transistor P108 has a source-drain path coupled between the high power supply voltage VCC and the first output node 114. The gate of the boost pull-up transistor P108 is coupled to the pulse generator 106.

The pulse generator 106 of the preferred embodiment 100 is shown to include a pulse input 124 and a pulse output 126. In response to predetermined logic transitions at the pulse input 124, the pulse generator 106 provides a pulse at the pulse output 126. The pulse generator 106 provides a low-going pulse in response to a low-to-high transition at the pulse input 124. In the configuration of the preferred embodiment 100, the pulse generator 106 has its pulse input 124 coupled to the first output node 114 and its pulse output 126 coupled to the gate of the boost pull-up transistor P108.

The pulse generator 106 of the preferred embodiment 100 is set forth in detail in FIG. 1. The pulse generator 106 is shown to include an input inverter I100, a delay circuit 128, two p-channel MOS transistors P110 and P112, and two n-channel MOS transistors N106 and N108. Transistors P110, P112, N106 and N108 are arranged in a NAND gate configuration, with transistors P110 and P112 being arranged in parallel between the high power supply voltage VCC and the pulse output 126. Transistors N102 and N108 are arranged in series between the pulse output 126 and the low power supply voltage VSS. The gates of transistors P110 and N106 are commonly coupled to the first output node 114, providing a non-delayed input path to the NAND gate. The gate of transistors P112 and N108 are coupled to the output node 114 by the series arrangement of the inverter I100 and delay circuit 128. Thus, the inverter I100 and the delay circuit 128 provide a delayed input path to the NAND gate. The output of the delay circuit 128 is designated as a delay node 130, as it provides a response that is delayed with respect to that of the first output node 114. In the preferred embodiment 100, because a NAND gate configuration is employed, the delayed input is an inverting delayed input.

The delay circuit 128 may include a number of well-known delay elements. A series of inverters, with or without additional capacitors could be employed. It is noted that in the preferred embodiment 100 the amount of delay introduced by the delay circuit 128 is programmable according to a "metal" option. That is, the number of inverters and/or amount of capacitance can be increased by a number of interconnection options determined at a fabrication step. Post fabrication adjustment could also be implemented via fuse structures, such as fusible links, programmable fuses or "anti-fuse" devices.

The pulse generator 106 maintains high logic level at the pulse output 126 in response to a high-to-low transition at the pulse input 124. When the pulse input 124 is high, transistor P110 is turned off and transistor N106 is turned on. At the same time, inverter I100 creates a logic low at the delay node 130, turning off transistor N108, and turning on transistor P112. Transistor P112 pulls the pulse output 126 to the high power supply voltage VCC. As the pulse input 124 transitions low, transistor N106 is turned off and transistor P110 is turned on. Transistor P110 thus helps to maintain the pulse output 126 at the high power supply voltage VCC. After a delay established by inverter I100 and the delay circuit 128, the delay node 130 is driven high, turning transistor P112 off and transistor N108 on. Because transistor N106 was previously turned off, when transistor N108 is turned on the logic level at the pulse output 126 does not vary.

As noted previously, unlike the case of the high-to-low transition, the low-to-high transition results in a low-going pulse at the pulse output 126. When the pulse input 124 is low, transistor P110 is turned on, coupling the pulse output 126 to the high power supply voltage VCC. Transistor N106 is turned off. At the same time, the delay node 130 is high, turning transistor P112 off and transistor N108 on. As the pulse input 124 transitions high, transistor N106 is turned on and transistor P110 is turned off. Because a high logic value is still present at the delay node 130, transistor N108 remains on. In this manner, following the low-to-high transition at the first output node 114, transistors N106 and N108 are both on, and the pulse output 126 is pulled to a logic low value, initiating a low-going pulse. After the delay established by inverter I100 and the delay circuit 128, the delay node 130 transitions low, turning off transistor N108 and turning on transistor P112. In this manner, transistor P112 pulls the pulse output 126 back up to a logic high value, terminating the low-going pulse. In this manner, the pulse provided by the pulse generator 106 initiates and terminates a "boost" pulse, which indicates the duration of a boost operation by the boost section 108.

An alternate way of conceptualizing the preferred embodiment 100 is to consider the pulse generator 106 a boost control device which activates the boost section 108. The activation can be considered "temporary", as it is of a limited duration with respect to the low portion of the CLKX cycle.

The hysteresis section 112 of the preferred embodiment 100 is shown in FIG. 1 to include an n-channel MOS hysteresis enable transistor N110, and an n-channel MOS feedback transistor N112. The hysteresis enable transistor N110 and feedback transistor N112 have their source-drain paths arranged in series between the first output node 114 and the low power supply voltage VSS. The gate of the hysteresis enable transistor N110 receives a hysteresis enable signal HYS. The gate of the feedback transistor N112 is coupled to the second output node 122. In this arrangement, as long as the HYS signal is low (no hysteresis) the hysteresis section 114 does not alter the general operation of the preferred embodiment 100. If, however, the HYS signal is high (hysteresis enabled) and the CLKI signal at the second output node 122 is also high, both the hysteresis enable transistor N110 and N112 will be turned on, coupling the first output node 114 to the low power supply voltage VSS. With both of the transistors (N110 and N112) of the hysteresis section 112 on, the first buffer section 102 must overpower the hysteresis section 112 in order to drive the first output node 114 high. As a result, the CLKX signal must go lower in order to cause a low-to-high transition at the first output node 114. In the preferred embodiment 100 the sizes of the hysteresis transistors N110 and N112 are smaller than the pull-up transistor P100 and the current supply transistor P102. The ratio of the channel widths between P102, P100, N110 and N112 are 80:15:3:3, respectively.

Figure 2:
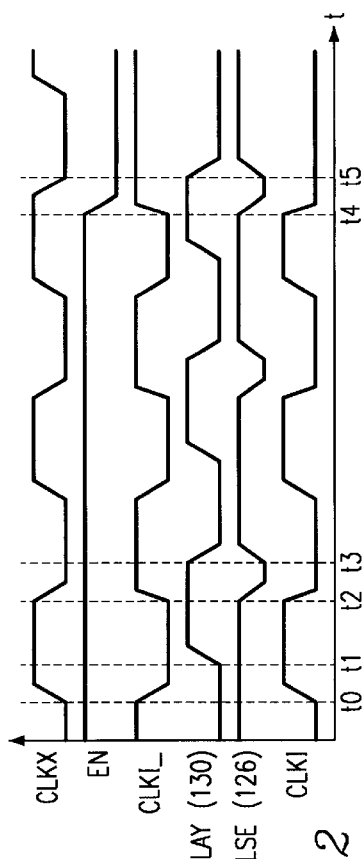
FIG. 2 is a timing diagram illustrating the response of the preferred embodiment set forth in FIG. 1.

The operation of the preferred embodiment 100 is best understood with reference to FIG. 1 in conjunction with FIG. 2. FIG. 2 is a timing diagram illustrating the various input signals, output signals, and the response of selected nodes set forth in FIG. 1. FIG. 2 includes the CLKX signal, the EN signal, the response of the first output node 114 (shown as "CLKI_"), the response of the delay node 130 (shown as "DELAY"), the response of the pulse output 126 (shown as "PULSE"), and the CLKI signal. For the purposes of this description, it is assumed that the hysteresis capabilities of the circuit are disabled, with the HYST signal being low.

Referring now to FIG. 2, the CLKX signal set forth is shown to be periodic system clock, having low-to-high transitions and high-to-low transitions. In the preferred embodiment 100, it is assumed that noise on high-to-low transitions is of concern, as such noise could be misinterpreted as low-to-high transitions.

Referring now to FIG. 1 in conjunction with FIG. 2, the operation of the preferred embodiment 100 will be described. Prior to time t0, the CLKX signal is low, and the EN signal is high. With the EN signal high, the enabling section 110 is in the enabled state, with transistor P104 being turned off, and transistor N102 being turned on. With the CLKX signal low, transistor P100 is turned on, and the first output node 114 is pulled to the high power supply voltage VCC by the source-drain paths of transistors P100 and P102. Transistor N100 is turned off, isolating the first output node 114 from the low power supply voltage VSS. The high logic level at the first output node 114 results in the high CLKI_ signal being high.

The high logic level of the first output node 114 further results in transistor P110 within the pulse generator 106 being turned off, and the transistor N106 being turned on. The high logic at the first output node 114 is further inverted by inverter I100, creating a low logic level at delay node 130, turning off transistor N108, and turning on transistor P112. With transistor P112 turned on, the pulse node 126 is high.

With the pulse node 126 at a high logic level, transistor P108 within the boost section 108 is turned off. In addition, the high logic level of the first output node 114 turns on transistor N104 and turns off transistor P106, within the second output buffer 104. In this manner, the CLKI signal is driven low.

At time t0, the CLKX signal makes a low-to-high transition. The EN signal remains high, maintaining the enabling section 110 in the enabled state. As the CLKX signal rises, transistor P100 is turned off, and transistor N100 is turned on. The first output node 114 begins falling to the low power supply voltage VSS, by way of the source-drain paths of transistors N102 and N100.

As the logic level of the first output node 114 begins to fall, transistor P110 within the pulse generator 106 will turn on, and transistor N106 will turned off. Due to the delay introduced by the inverter I100 and delay circuit 128, the delay node 130 remains at the low logic level, maintaining transistor N108 in the off state and transistor P112 in the on state. The pulse node 126 thus remains high, and transistor P108 within the boost section 108 remains off. As the first output node 114 falls to a low logic value, transistor N104 will turn off and transistor P106 will turn on, resulting in the CLKI signal transitioning from low to high.

At time t1, the low logic level at the first output node 114 has propagated through inverter I100 and the delay circuit 128 within the pulse generator 106, resulting in a high logic value at the delay node 130. Because transistor N106 is turned off, there is no change in the logic level at the pulse output 126.

At time t2, the CLKX signal makes a high-to-low transition, the type of transition in which it is desirable to avoid the adverse effects of noise. The EN signal remains high, maintaining the enabling section 110 in the enabled state. As the CLKX signal falls, transistor P100 will be turned back on, and transistor N100 will be turned off. The first output node 114 will thus being charging to the high power supply voltage VCC, at a first rate, established by the characteristics of transistors P102 and P100.

As the logic level of the first output node 114 begins to rise, transistor P110 within the pulse generator 106 will turn off and transistor N106 will turned on. Due to the delay introduced by the inverter I100 and delay circuit 128, the delay node 130 remains at the high logic level, keeping transistor N108 turned on. In this manner, the overlapping high logic of the first output node 114 and the delay node 130 result in the pulse output 126 being pulled low, via the source-drain paths of the transistors N106 and N108. As the pulse node 126 falls in potential, transistor P108 within the boost section 108 turns, boosting the charging of the first output node 114. Thus, during the duration of the low-going pulse at the pulse output 126, the first output node 114 is charged at a second rate, determined not only by the characteristics of transistors P102 and P100 within the first buffer section 102, but also the additional charging action of transistor P108 within the boost section 108. As the first output node 114 rises to a high logic value, transistor N104 will turn on and transistor P106 will turn off, resulting in the CLKI signal transitioning from high to low.

At time t3, the high logic level at the first output node 114 propagates through inverter I100 and the delay circuit 128 within the pulse generator 106, resulting in a low logic value at the delay node 130. Transistor N108 is turned off, and transistor P112 is turned, pulling the pulse output 126 back up to the high power supply voltage VCC. The pulse at the pulse output 126 is terminated, and the boost operation of transistor P108 is halted.

It is noted that the duration of the low-going pulse at the pulse output 126 is shorter than the half-cycle of the CLK signal. Therefore, the pulse (and hence the boosting operation) is terminated by the time the first output node 114 must be pulled back down again. In this arrangement, when transistors N102 and N100 discharge the first output node 114, they will not have to overpower transistor P108, which could result in delaying the falling edge of the CLKI_signal (and hence the rising edge of the CLKI signal). The pulse duration can thus be considered as being less than a half-cycle of the CLKX signal. The term "half-cycle" is not intended to indicate the temporal division of the CLKX cycle, but rather the logical division. A first half-cycle being at one logic level (low, for example) and a second half-cycle being at another logic level (high, for example).

The timing diagram of FIG. 2 also illustrates the way in which the preferred embodiment 100 can be disabled and enabled according to the EN signal. At time t4, the EN signal falls from high-to-low, disabling the preferred embodiment 100. With the EN signal low, transistor P104 is turned on and transistor N102 is turned off. With transistor P104 on, first output node 114 is pulled to the high power supply voltage, by way of transistor P102, regardless of the value of the CLKX signal. With transistor N102 turned off, the first output node 114 is isolated from the low power supply voltage VSS. The high logic at the first output node 114 turns on transistor N106. Transistor N108 remains on, and a pulse is generated at the pulse output 126, as previously described in conjunction with a high-to-low CLKX transition. The first output node 114 is thus pulled high by the first buffer section 102 and the boost section 108. With the first output node high 114, the CLKI signal is driven low.

At time t5, the pulse terminates, turning off transistor N108 and turning on transistor P112. The pulse output 126 returns to the high logic level. The first output node 114 will thus remain in the high logic state, and the CLKI signal will remain in the low logic state, as long as the EN signal is low.

It is noted that in the disabled state, the first output node 114 of the preferred embodiment 100 is at the high power supply voltage VCC. Thus, in the event the first output node 114 is low (in the enabled state) at the time the EN signal falls, the pulse generator 106 and boost section 108 will assist in placing the first output node 114 in the high logic (disabled high) state.

While the preferred embodiment 100 can be utilized in an SDRAM, it is understood that the teachings set forth herein may be applied to other devices in which noise on a clock signal can adversely affect the operation of the device. Along these same lines, while the preferred embodiment 100 addresses noise on the falling edge of a received clock, the buffering of a rising edge of a clock signal may be similarly improved by the teachings set forth herein.

Accordingly, it is understood that although one preferred embodiment has been described in detail, various changes, substitutions, and alterations could be made without departing from the spirit and scope of the invention as defined by the appended claims.

What is claimed is:

1. A clock buffer circuit comprising:
    a first buffer circuit for generating logic transitions at a first output node in response to logic transitions in an external clock signal;
    a pulse generator for generating a boost pulse at a pulse node in response to the first buffer circuit driving the first output node to a first logic level, comprising:
        a first IGFET and a second IGFET having source-drain paths coupled in series between the pulse node and a second power supply voltage,
        a non-delay path coupled between the first output node and the gate of the first IGFET, and
        a delay path coupled between the first output node and the gate of the second IGFET and
    a boost circuit coupled between the first output node and a first power supply voltage corresponding to the first logic level, and coupled to the pulse node, the boost circuit for providing a low impedance path between the first output node and the first power supply voltage responsive to the boost pulse.

2. The clock buffer circuit of claim 1, wherein:
    the boost circuit includes a boost insulated gate field effect transistor (IGFET) having a source-drain path coupled between the first power supply voltage and the first output node, the gate of the boost IGFET receiving the boost pulse.

3. The clock buffer circuit of claim 2, wherein:
    the first power supply voltage is a high power supply voltage; and the boost IGFET is a p-channel IGFET.

4. The clock buffer circuit of claim 1, wherein:
    the first IGFET and the second IGFET are portions of logic gate having a first input and a second input, the first input being coupled to the gate of the first IGFET, the second input being coupled to the gate of the second IGFET.

5. The clock buffer circuit of claim 4, wherein:
the logic gate of the pulse generator is formed from complementary IGFETS.

6. The clock buffer circuit of claim 5, wherein:
the logic gate of the pulse generator is a NAND gate, and the delay path is an inverting delay path.

7. The clock buffer circuit of claim 1, wherein:
the delay path of the pulse generator includes a programmable delay circuit.

8. The clock buffer circuit of claim 1, wherein:
the external clock signal is a periodic signal having a first half-cycle; and
the duration of the boost pulse generated by the pulse generator is less than the duration of the first half-cycle.

9. In a semiconductor device, a circuit for buffering an externally applied signal that transitions between logic states, the circuit comprising:
a first buffer section coupled between an external signal input node and a first output node, including:
a first input buffer device that provides a low impedance path between a first logic level and the first output node when the external signal input node is at a first predetermined potential, and
a second input buffer device that provides a low impedance path between a second logic level and the first output node when the external signal input node is at a second predetermined potential;
a boost control section coupled to the first output node, the boost control section generating a temporary boost indication responsive to the first output node making a transition from the second logic level to the first logic level;
a boost section coupled to the first output node, the boost section providing a low impedance path between the first logic level and the first output node in response to the temporary boost indication; and
an enable section coupled to the first buffer section, the enabling section including a disable device coupled between the first output node and the second input buffer device, the disable device providing a high impedance path between the first output node and the second input buffer device when disabled.

10. The circuit of claim 9, further including:
a second buffer section coupled between the first output node and a second output node, including
a first output buffer device that provides a low impedance path between the first logic level and the second output node when the first output node is at the second logic level, and
a second output buffer device that provides a low impedance path between the second logic level and the second output node when the first output node is at the first logic level.

11. The circuit of claim 9, further including:
a hysteresis section coupled between the first output node and the second logic level, the hysteresis section providing a low impedance path between the first output node and the second logic level when enabled.

12. The circuit of claim 11, wherein:
the hysteresis section includes a first hysteresis insulated gate field effect transistor (IGFET) transistor coupled in series with a second hysteresis IGFET, the source-drain paths of the first and second hysteresis IGFETs being coupled between the first output node and the second logic level.

13. The circuit of claim 12, further including:
a second buffer section coupled between the first output node and a second output node; and
the gate of the first hysteresis IGFET is coupled to the second output node, the gate of the second hysteresis IGFET receives a hysteresis enable signal.

14. The circuit of claim 11, wherein:
the boost control section includes a pulse generator, and the temporary boost indication is a pulse.

* * * * *